US010503851B2

(12) United States Patent
Huang et al.

(10) Patent No.: US 10,503,851 B2
(45) Date of Patent: Dec. 10, 2019

(54) CMOS-PHOTONICS CO-DESIGN

(71) Applicant: Hewlett Packard Enterprise Development LP, Houston, TX (US)

(72) Inventors: Tsung-Ching Huang, Palo Alto, CA (US); Chin-Hui Chen, Palo Alto, CA (US); Marco Fiorentino, Mountain View, CA (US); Raymond G. Beausoleil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/065,716

(22) PCT Filed: Jan. 22, 2016

(86) PCT No.: PCT/US2016/014603
§ 371 (c)(1),
(2) Date: Jun. 22, 2018

(87) PCT Pub. No.: WO2017/127116
PCT Pub. Date: Jul. 27, 2017

(65) Prior Publication Data
US 2019/0018919 A1    Jan. 17, 2019

(51) Int. Cl.
*G06F 17/50*    (2006.01)
(52) U.S. Cl.
CPC ...... *G06F 17/5036* (2013.01); *G06F 17/5009* (2013.01); *G06F 17/5045* (2013.01);
(Continued)
(58) Field of Classification Search
CPC ............. G06F 17/5036; G06F 17/5068; G06F 17/5045; G06F 17/5081; G06F 17/5063; G06F 17/5009
See application file for complete search history.

(56) References Cited

U.S. PATENT DOCUMENTS 6,675,139 B1 *   1/2004  Jetton ................. G06F 17/5036
                                                                  703/13
7,787,713 B2 *   8/2010  Roberts ................. G02F 1/0121
                                                                  385/1
(Continued)

OTHER PUBLICATIONS

Rakowski, M. et al.; "Low-Power, 10-Gbps 1.5-Vpp Differential CMOS Driver for a Silicon Electro-Optic Ring Modulator"; Sep. 22, 2012; 6 pages.
(Continued)

*Primary Examiner* — Stacy Whitmore
(74) *Attorney, Agent, or Firm* — Hewlett Packard Enterprise Patent Department

(57) ABSTRACT

In example implementations, a method executed by a processor is provided. The method receives a simulated photonic data input based on a theoretical photonic design that meets a target specification. A complementary metal-oxide semiconductor (CMOS) circuit design is designed based on the simulated photonic data input using a pre-layout simulation. An experimental photonic data input based on a fabricated photonics device that meets the target specification is received. The CMOS circuit is designed based on the experimental photonic data input using a post-layout simulation. A physical circuit CMOS circuit design and a layout that includes detailed physical dimensions associated with the physical CMOS circuit design that is based on the pre-layout and the post-layout are transmitted to a CMOS foundry.

15 Claims, 5 Drawing Sheets

(52) U.S. Cl.
CPC ...... *G06F 17/5063* (2013.01); *G06F 17/5068* (2013.01); *G06F 17/5081* (2013.01)

(56) References Cited

U.S. PATENT DOCUMENTS

| | | | |
|---|---|---|---|
| 8,671,367 B2* | 3/2014 | Wang | G06F 17/5068 716/50 |
| 9,082,808 B2* | 7/2015 | Thacker | H01L 25/0652 |
| 9,671,335 B2* | 6/2017 | Bienstman | G01N 21/45 |
| 10,009,668 B2* | 6/2018 | Liboiron-Ladouceur | H04Q 11/0005 |
| 2002/0156929 A1* | 10/2002 | Hekmatpour | G06F 17/50 719/310 |
| 2005/0129348 A1 | 6/2005 | Iwasaki | |
| 2006/0026550 A1* | 2/2006 | Tzu | G03F 1/00 430/5 |
| 2008/0226305 A1* | 9/2008 | Roberts | G02F 1/0121 398/183 |
| 2008/0301605 A1 | 12/2008 | Ando et al. | |
| 2009/0143874 A1 | 6/2009 | Dowski, Jr. et al. | |
| 2012/0243828 A1 | 9/2012 | Suzuki | |
| 2012/0328235 A1 | 12/2012 | Christensen et al. | |
| 2014/0068534 A1 | 3/2014 | Lee et al. | |
| 2015/0062689 A1 | 3/2015 | Doerr | |
| 2015/0129836 A1* | 5/2015 | Augusto | H01L 27/14603 257/13 |
| 2015/0180582 A1* | 6/2015 | Zhou | H03F 3/08 398/182 |
| 2015/0295650 A1 | 10/2015 | Lee et al. | |
| 2015/0371890 A1* | 12/2015 | Huff | B81C 99/0055 438/618 |
| 2016/0314091 A1* | 10/2016 | Dutt | G06F 12/0817 |

OTHER PUBLICATIONS

Zheng, X. et al.; "A High-speed, Tunable Silicon Photonic Ring Modulator Integrated with Ultra-efficient Active Wavelength Control"; May 16, 2014; 6 pages.

* cited by examiner

CMOS-PHOTONICS CO-DESIGN

STATEMENT OF GOVERNMENT INTEREST

This invention was made with government support under Contract No. H98230-14-3-0011, awarded by the Maryland Procurement Office. The government has certain rights in this invention.

BACKGROUND

Photonic devices are used to generate, control and detect light. Photonic components such as high speed microring modulators can be used for high-throughput optical links. The modulator driver can be designed and fabricated using complementary metal-oxide semiconductor (CMOS) technology for energy efficiency and manufacturing cost.

DETAILED DESCRIPTION

The present disclosure discloses an example apparatus and method for designing and fabricating a CMOS-photonics device. For example, CMOS-photonics devices use a combination of optical components (e.g., a mircoring modulator) with a pre-emphasis driver deployed in a CMOS chip to provide improved performance. If the zeros of the pre-emphasis signals can be well matched with the pole locations of the optical components, then the total frequency response time may be flat with a higher bandwidth. This may imply higher possible data rates.

However, designing and fabricating the CMOS-photonics devices can be an inefficient and laborious process. Currently, the CMOS portion of the device and the photonics portion of the device are developed separately. For example, a CMOS foundry may estimate characteristics or performance parameters of the optical design using "back of the envelope" calculations. As a result, when the CMOS-photonics device is fabricated and deployed, the CMOS-photonics device may not operate or perform as expected. As a result, both the CMOS foundry and the photonics foundry may re-design each respective portion of the device independent of one another. This process can take several months or years until an optical CMOS-photonics device is completed.

Figure 1:
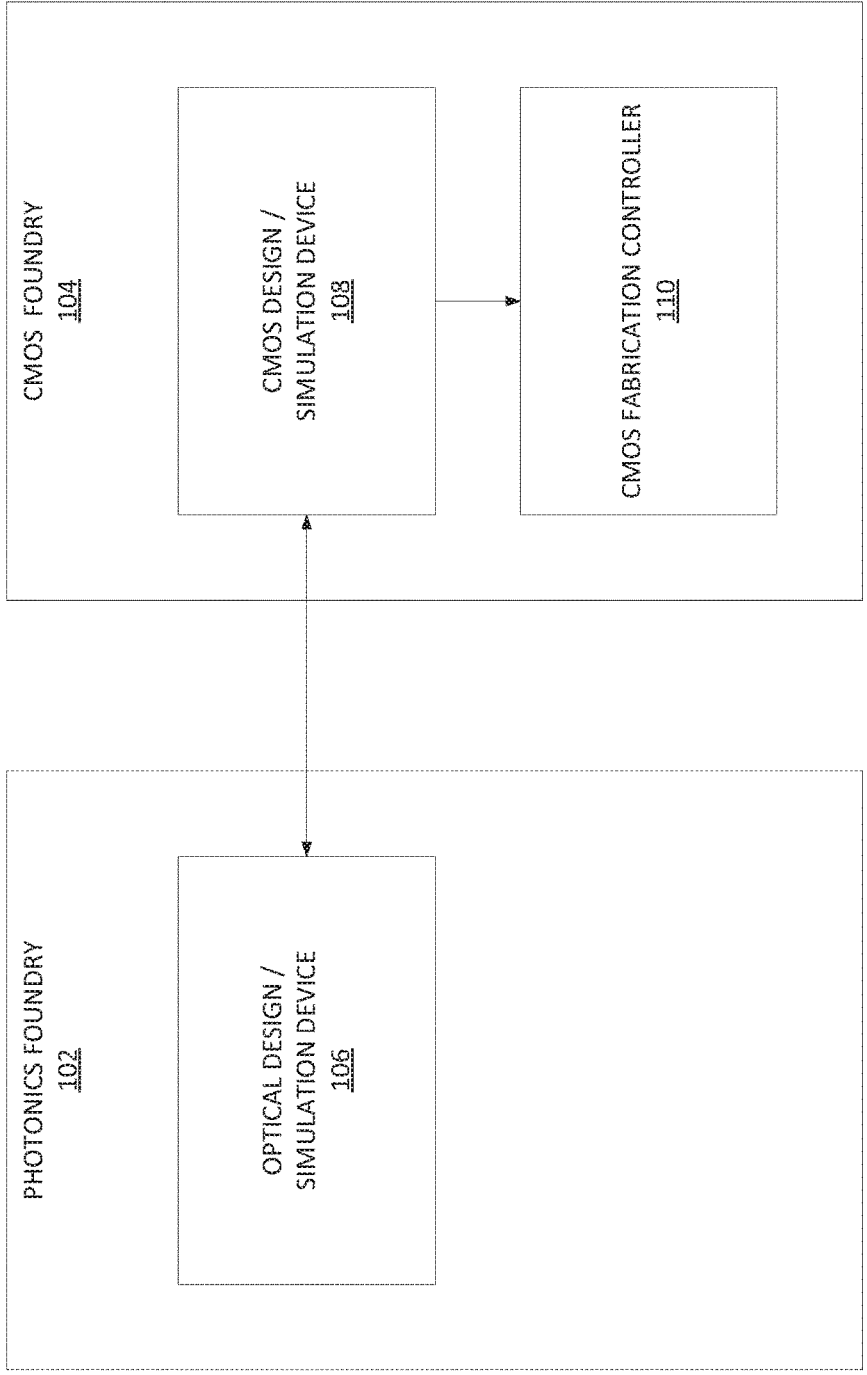
FIG. 1 is a block diagram of an example system of the present disclosure.

Examples of the present disclosure bring the design and fabrication of the CMOS foundry and photonics foundry together, thereby significantly reducing the design time and increasing the design productivity of the CMOS drivers for photonic components, such as microring modulators for high-bandwidth nanophotonic links. In other words, the CMOS design is designed based off of the optical design, rather than designing the CMOS portion and the optical portion independent of one another. As a result, the CMOS-photonics device can be designed and fabricated more efficiently with confidence that the CMOS-photonics device will operate optimally as expected when deployed, FIG. 1 illustrates an example system 100 of the present disclosure. In one example, the system 100 may include a photonics foundry 102 and a CMOS foundry 104. In one example, the photonics foundry 102 and the CMOS foundry 104 may be remotely located from one another.

In one example, the photonics foundry 102 may include an optical design and simulation device 106. The optical design and simulation device 106 may be deployed as a computing device or a system of computing devices having a processor and memory. The memory may store instructions associated with programs executed by the processor to perform the optical design and simulation of the optical design.

In one example, the CMOS foundry 104 may include a CMOS design and simulation device 108 and a CMOS fabrication controller 110. The CMOS design and simulation device 108 may be deployed as a computing device or a system of computing devices having a processor and memory. The memory may store instructions associated with programs executed by the processor to perform the CMOS design and simulation of the CMOS design. The CMOS fabrication controller 110 may be deployed as a computing device or a system of computing devices having a processor and memory. The memory may store instructions associated with programs executed by the processor to control tools in the CMOS foundry that are used to fabricate the CMOS circuit or device based on the CMOS design.

In one implementation, the optical design and simulation device 106 may be in communication with the CMOS design and simulation device 108 via a wired or wireless connection. For example, the wired or wireless connection may be over an Internet Protocol (IP) network, the Internet, a cellular network, and the like.

In one example, the optical design and simulation device 106 may provide various parameters associated with a fabricated photonics device created by the photonics foundry 102. The various parameters may be S-parameters that can be used to develop SPICE (Simulation Program with Integrated Circuit Emphasis)-compatible models in the CMOS design and simulation device 108. The S-parameters may include resistance values, capacitance values, inductance values, and the like, associated with the simulated operation of the fabricated photonics device. SPICE models are an open source analog electronic circuit simulator.

The CMOS design and simulation device 108 may then create a physical CMOS circuit design based on the various parameters received from the optical design and simulation device 106. In other words, the CMOS design and simulation device 108 works with a design of an actual fabricated photonics device rather than trying to estimate or guess the parameters of a photonics design. By receiving the various parameters associated with a fabricated photonics device from the optical design and simulation device 106, the CMOS design and simulation device 108 may create the physical CMOS circuit design more efficiently and accurately.

Figure 2:
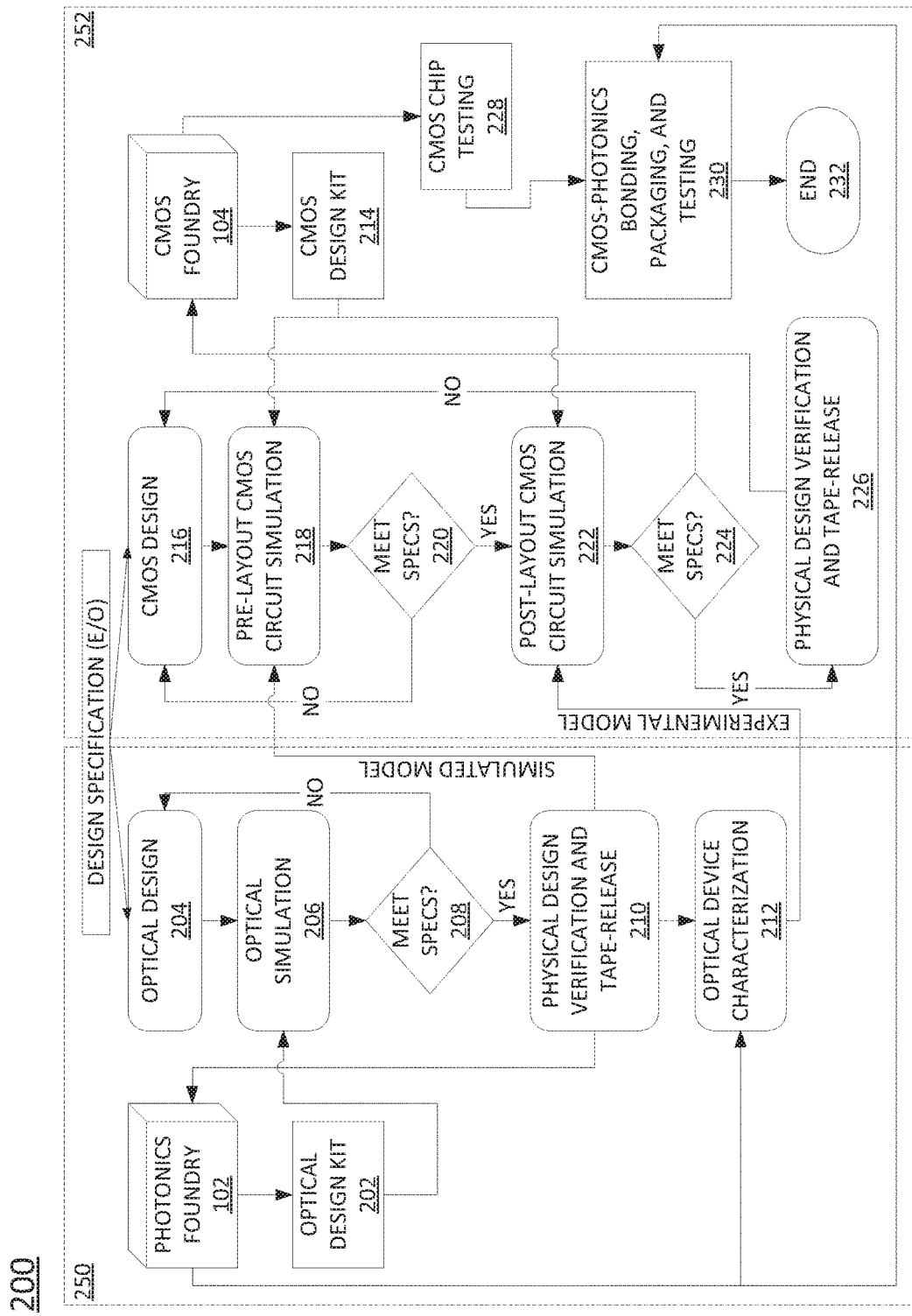
FIG. 2 is a block flow diagram of an example method for designing a CMOS-Photonics device.

FIG. 2 illustrates a block diagram of an example method 200 for designing a CMOS-Photonics device. A portion 250 of the method 200 is performed at the photonics foundry 102 as part of the process for designing the fabricated photonics device. A portion 252 of the method 200 is performed at the CMOS foundry 104 as part of the physical CMOS circuit design process.

The method 200 begins at the photonics foundry 102. At block 202, the method 200 may use an optical design kit to create a design for a photonics device that will be fabricated. In one example, the optical design kit may be a photonics design kit (PDK) and microring cell library. The PDK and microring cell library may be software that includes various set up files, example materials and cross-sectional information for simulations, templates, passive building blocks (e.g., waveguide definitions, fiber chip couplers, waveguide crossings, modulators, phase shifters, detectors, pads for P and N contacts, and the like), design rules, graphics generators, and the like. The optical design kit may be loaded into memory and executed by hardware such as the optical design simulation device 106.

In one example, the design for the photonics device created by the optical design kit at block 202 may include an optical modulator such as a microring modulator. The microring modulator may include a variety of resistors and capacitors that operate at a particular voltage for a particular application. The design of a photonics device may be passed to a simulator for an optical simulation at block 206.

At block 206, the method 200 simulates operation of a photonics device design that is created at block 202. The simulation may generate various parameters associated with the photonics device design. The various parameters may include S-parameters that include resistance values, inductance values, capacitance values, and the like. The S-parameters can be used to develop SPICE compatible models for the CMOS foundry, as discussed below.

At block 208, the method 200 determines if the photonics device design meets specifications. For example, a particular application may have an associated set of target specifications. Different applications may have different target specifications. The target specifications may be related to a particular data rate, a particular operating voltage, and the like.

If the specifications are not met, the method 200 may proceed to block 204 for optical redesign. At block 204, the photonics device design may be modified or adjusted to meet the specifications for the particular application. The method 200 may then proceed to block 206 again.

Referring back to block 208, if the specifications are met, the method 200 may proceed to block 210. At block 210 the photonics device design is verified and a tape-release is performed. For example, the photomask for the fabricated photonics device may be created from the final approved design for the photonics device design.

In one example, the final approved photonics device design may be provided to the photonics foundry at block 102. The photonics foundry may fabricate the photonics device based on the final approved design from block 210.

The photonics device design and the various parameters of the simulated model may also be provided (e.g., transmitted) to the CMOS foundry at block 218. At block 218, the method 200 may perform a pre-layout simulation of a CMOS circuit design based on an input of simulated photonic data input that is received. The simulated photonic data input may be based on the photonics device design and simulations that were performed in block 206 that meet the specifications at block 208. In one example, the pre-layout simulation at block 218 may include a simulation of the CMOS circuit design before the dimensions of physical components within the physical CMOS circuit design are completed or known.

As a result, the physical CMOS circuit design may be created in the present disclosure with an additional input from the photonics foundry 102 that was not previously used. As a result, exact parameters associated with a fabricated photonics device that is actually created can be used to create an accurate physical CMOS circuit design. In other words, the fabricated photonics device that will be used with the physical CMOS circuit design is no longer estimated or obtained using backward calculations. This helps to improve the efficiency and the accuracy of the physical CMOS circuit design.

As noted above, the physical CMOS circuit design may begin at the CMOS foundry 104. At block 214, the method 200 uses a CMOS design kit to create the physical CMOS circuit design. In one example, the CMOS design kit may include a process design kit (PDK) and standard cell library. The PDK and standard cell library may be software that includes various set up files, example materials, templates, building blocks, design rules, graphics generators, and the like. The CMOS design kit may be loaded into memory and executed by hardware such as the CMOS design and simulation device 108. The physical CMOS circuit design may be passed to a simulator for the pre-layout simulation of the CMOS circuit design at block 218.

Thus, at block 218, the method 200 may receive two inputs for creating and simulating the physical CMOS circuit design. Namely, the two inputs may be the simulated photonic data input from the photonics foundry 102 and the physical CMOS circuit design from the PDK.

In one example, the physical CMOS circuit design may be a modulator driver or a pre-emphasis driver that is used with the microring modulator. In one example, the pre-emphasis driver may use a finite impulse response (FIR) filter that uses a time delay. As noted above, generating a proper pre-emphasis driver that operates with the microring modulator may provide higher possible data rates.

At block 220, the method 200 determines if the physical CMOS circuit design meets specifications. For example, a particular application may have an associated set of target specifications. Different applications may have different target specifications. The target specifications may be related to a particular data rate, a particular frequency response, and the like.

If the specifications are not met, the method 200 may proceed to block 216 for CMOS design. At block 216, the physical CMOS circuit design may be modified or adjusted to meet the specifications for the particular application. The method 200 may then proceed to block 218 again.

Referring back to block 220, if the specifications are met, the method 200 may proceed to block 222. At block 222, the method 200 performs a post-layout simulation of the physical CMOS circuit design. A post-layout simulation may include a simulation based on actual physical dimensions of the circuit design (e.g., lengths of traces, spacing between traces and vias, geometry of traces and vias, voids, and the like).

Again at block 222, the post-layout simulation may occur based on two inputs rather than a single input from the CMOS design kit in block 214. For example, the second input may be experimental photonic data input received from experiments performed at the photonics foundry 102.

Referring back to the portion 250 at the photonics foundry 102, after block 210, the fabricated photonics device may be provided by the photonics foundry 102 to block 212. At block 212, the method 200 may perform optical device characterization on the fabricated photonics device. For example, at block 212, the method 200 may fine tune the design of the fabricated photonics device by obtaining experimental photonic data based on how the fabricated photonics device operates with various different CMOS circuit designs (e.g., different pre-emphasis drivers).

For example, at block 212 the fabricated photonics device may be operated with various CMOS circuit designs to compare results between the simulated photonic data and the experimental photonic data. For example, the optical device characterization may show that the optical eyes for the CMOS-photonics device may not be as optimal when the fabricated photonics device is operating with the CMOS circuit design. For example, various parameters (e.g., voltage, the time delay of the CMOS circuit design, and the like) may be adjusted, varied or optimized to fine tune the performance of the fabricated photonics device. In other words, at block 212 the CMOS circuit design may be adjusted by adjusting the driving condition until the experimental photonic data converges with the simulated photonic data. The experimental photonic data may then be provided (e.g., transmitted) to the CMOS foundry 104 at block 222 for the post-layout simulation of the physical CMOS circuit design.

Referring back to the portion 252 at the CMOS foundry 104, the method 200 determines if the physical CMOS circuit design meets specifications at block 224. For example, the target specifications at block 224 may be the same as the target specifications that were used for comparison at block 220.

If the specifications are not met, the method 200 may proceed back to block 216 for CMOS design. At block 216, the physical CMOS circuit design may be modified or adjusted to meet the specifications for the particular application. The method 200 may then proceed to block 218 and blocks 218-224 may be repeated.

Referring back to block 224, if the specifications are met, the method 200 may proceed to block 226. At block 226, the physical CMOS circuit design is verified and a tape-release is performed. For example, the photomask for the physical CMOS circuit design may be created from the final approved physical CMOS circuit design. The physical CMOS circuit design may then be sent to the CMOS foundry at block 104.

At block 228, after the CMOS foundry receives the physical CMOS circuit design at block 104, the physical CMOS circuit design may be fabricated into a CMOS chip and the CMOS chip may be tested. For example, the physical CMOS circuit design may include the design of the fabricated photonics device to create the CMOS-photonics device. In one example, the physical CMOS circuit design may be sent as a physical CMOS circuit design database that includes all the dimensions of the layouts of the physical CMOS circuit design. The design parameters associated with the final physical CMOS circuit design, the design of the fabricated photonics device, and a layout that includes detailed physical dimensions associated with the physical CMOS circuit design may be provided (e.g., transmitted) to a CMOS fabrication controller that controls the operation of tools used to fabricate the CMOS chip.

At block 230, the method 200 may perform CMOS-Photonics bonding, packaging and testing. In other words, the photonics device may be fabricated and combined with the fabricated physical CMOS circuit. The combined CMOS-Photonics device may be tested. The method 200 may end at block 232.

Figure 3:
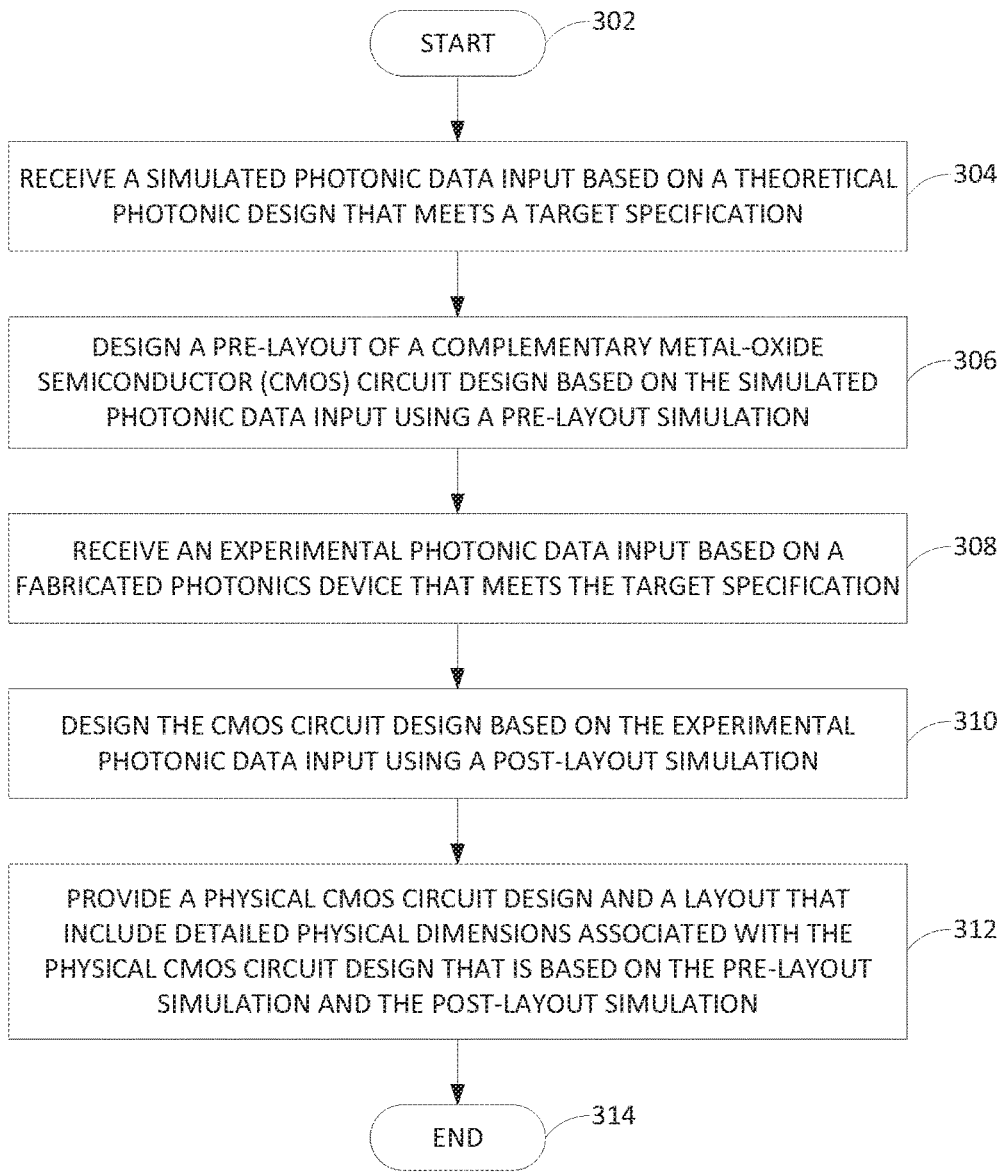
FIG. 3 is a flow diagram of an example method for designing a CMOS-Photonics device.

FIG. 3 illustrates a flow diagram of an example method 300 for designing a CMOS-Photonics device. In one example, the blocks of the method 300 may be performed by the CMOS device and simulation device 108.

At block 302, the method 300 begins. At block 304, the method 300 receives a simulated photonic data input based on a theoretical photonic design device that meets a target specification. For example, a photonics foundry may use an optical design kit executed on an optical design and simulation device to create a theoretical photonic design that meets target specifications. In one example, the theoretical photonic design may be to fabricate a mircoring modulator.

In one example, the simulated photonic data input may include resistance values, capacitance values, inductance values, and the like. Data associated with the simulation of the theoretical photonic design may be transmitted to the CMOS foundry.

At block 306 the method 300 designs a complimentary metal-oxide semiconductor (CMOS) circuit based on the simulated photonic data input using a pre-layout simulation. For example, the pre-layout simulation of the CMOS circuit may be simulated using the simulated photonic data input that is received from the photonics foundry. In other words, designers may generate the simulated photonic data input that is sent. In one example, the CMOS circuit may be a pre-emphasis driver that is used with the fabricated photonics device as part of a CMOS-photonics device.

At block 308, the method 300 receives an experimental photonic data input based on a fabricated photonics device that meets the target specification. In one example, the fabricated photonics device may be fabricated based on the theoretical photonic design.

In one example, the fabricated photonics device may be fine-tuned by collecting experimental data related to how the fabricated photonics device operates with various different CMOS circuit designs (e.g., different pre-emphasis drivers). For example, different CMOS circuit designs with different operating parameters (e.g., different voltages, different time delays, and the like) may be used with the fabricated photonics device until the experimental data converges with the simulation data.

In one example, the experimental photonic data input may include optical test data under various driving conditions. For example, the various driving conditions may include pre-emphasis techniques (e.g., applying different pre-emphasis drivers having different voltages). The experimental data associated with the fabricated photonics device may be transmitted to the CMOS foundry.

At block 310, the method 300 designs the CMOS circuit based on the experimental photonic data input using a post-layout simulation. For example, the post-layout simulation of the CMOS circuit may be simulated using the experimental photonic data input that is generated after testing a photonics device fabricated by the photonics foundry.

Figure 4:
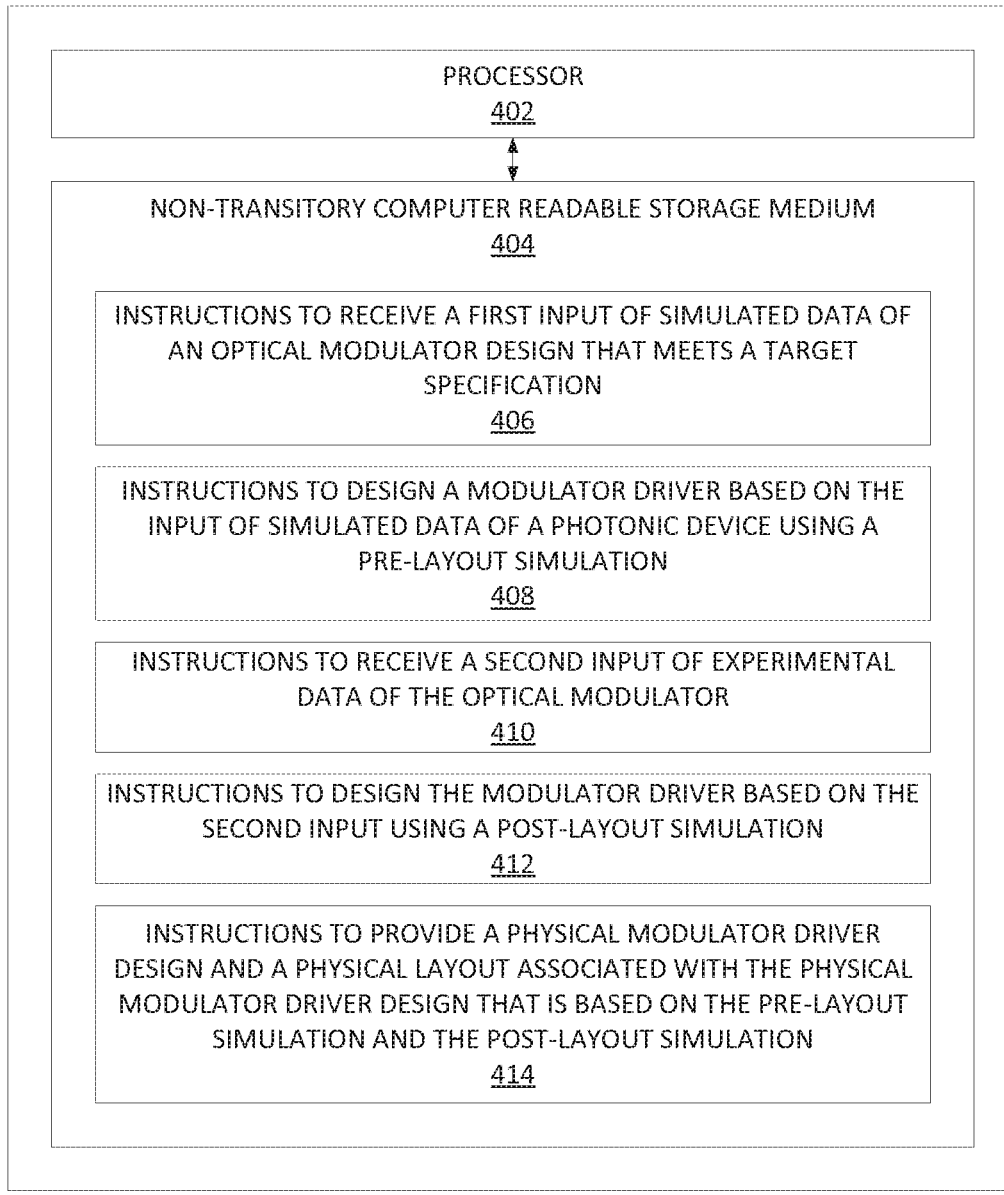
FIG. 4 is a block diagram of another example apparatus of the present disclosure.

At block 312, the method 300 provides a physical CMOS circuit design and a layout that includes detailed physical dimensions associated with the physical CMOS circuit design that is based on the pre-layout simulation and the post-layout simulation, for example, the physical CMOS circuit design and layout may be transmitted to a CMOS foundry. In one example, the physical CMOS circuit design may include a physical CMOS circuit design database that includes parameters associated with the fabricated photonics device. The physical CMOS circuit design may be transmitted to a controller that controls the CMOS fabrication in the CMOS foundry. At block 314, the method 300 ends, FIG. 4 illustrates an example of an apparatus 400. In one example, the apparatus may be the CMOS design and simulation device 108. In one example, the apparatus 400 may include a processor 402 and a non-transitory computer readable storage medium 404. The non-transitory computer readable storage medium 404 may include instructions 406, 408, 410, 412 and 414 that when executed by the processor 402, cause the processor 402 to perform various functions.

In one example, the instructions 406 may include instructions to receive a first input of simulated data of an optical modulator design that meets a target specification. The instructions 408 may include instructions to design a modulator driver based on the input of simulated data of a photonic device using a pre-layout simulation. The instructions 410 may include instructions to receive a second input of experimental data of the optical modulator. The instructions 412 may include instructions to design the modulator driver based on the second input using a post-layout simulation. The instructions 414 may include instructions to provide a physical modulator driver design and a physical layout associated with the physical modulator driver design that is based on the pre-layout simulation and the post-layout simulation. For example, a database of the physical modulator driver design and the physical layout may be transmitted to a complementary metal-oxide semiconductor (CMOS) foundry.

Figure 5:
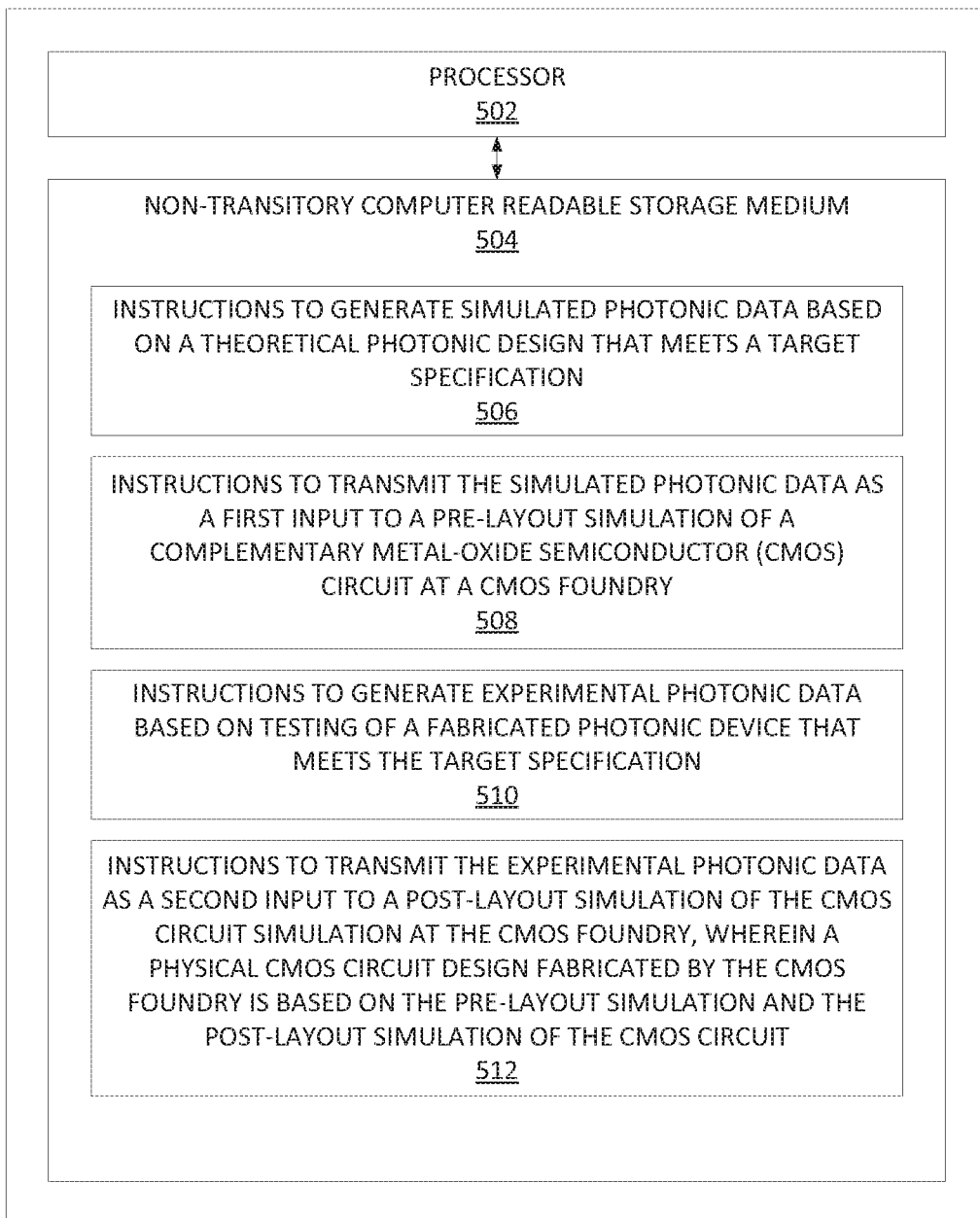
FIG. 5 is a block diagram of an example non-transitory computer readable medium storing instructions executed by a processor.

FIG. 5 illustrates an example of a non-transitory computer readable medium 504 that may include instructions 506, 508, 510 and 512 that when executed by a processor 502, cause the processor 502 to perform various functions. In one example, the non-transitory computer readable medium 504 and the processor 502 may be deployed in the optical design and simulation device 106.

In one example, the instructions 506 may include instructions to generate simulated photonic data based on a theoretical photonic design that meets a target specification. The instructions 508 may include instructions to transmit the simulated photonic data as a first input to a pre-layout simulation of a complementary metal-oxide semiconductor (CMOS) circuit at a CMOS foundry. The instructions 510 may include instructions to generate experimental photonic data based on testing of a fabricated photonic device that meets the target specification. The instructions 512 may include instructions to transmit the experimental photonic data as a second input to a post-layout simulation of the CMOS circuit simulation at the CMOS foundry, wherein a physical CMOS circuit design fabricated by the CMOS foundry is based on the pre-layout simulation and the post-layout simulation of the CMOS circuit.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A co-design method, comprising:
    receiving, by a processor, a simulated photonic data input based on a theoretical photonic design that meets a target specification;
    designing, by the processor, a complementary metal-oxide semiconductor (CMOS) circuit design based on the simulated photonic data input using a pre-layout simulation;
    receiving, by the processor, an experimental photonic data input based on a fabricated photonics device that meets the target specification;
    designing, by the processor, the CMOS circuit design based on the experimental photonic data input using a post-layout simulation; and
    providing, by the processor, a physical CMOS circuit design and a layout that includes detailed physical dimensions associated with the physical CMOS circuit design that is based on the pre-layout simulation and the post-layout simulation.

2. The co-design method of claim 1, wherein the simulated photonic data and the experimental photonic data are received from a photonics foundry.

3. The co-design method of claim 1, wherein the fabricated photonics device comprises optical modulators.

4. The co-design method of claim 1, wherein the physical CMOS circuit design comprises a modulator driver.

5. The co-design method of claim 1, wherein the experimental photonic data input includes optical test data under various driving conditions.

6. The co-design method of claim 5, wherein the various driving conditions include pre-emphasis techniques.

7. A co-design apparatus, comprising:
    a memory comprising instructions;
    a processor coupled to the memory, the processor to execute the instructions to:
        receive a first input of simulated data of an optical modulator design that meets a target specification;
        design a modulator driver based on the first input of simulated data of a photonic device using a pre-layout simulation;
        receive a second input of experimental data of an optical modulator based on the optical modulator design;
        design the modulator driver based on the second input using a post-layout simulation; and
        provide a physical modulator driver design and a physical layout associated with the physical modulator driver design that is based on the pre-layout simulation and the post-layout simulation.

8. The co-design apparatus of claim 7, wherein the simulated data and the experimental data are received from a photonics foundry.

9. The co-design apparatus of claim 7, wherein the instructions to design the modulator driver is based on a third input from a complementary metal-oxide semiconductor (CMOS) process design kit (PDK) from a CMOS foundry.

10. The co-design apparatus of claim 7, wherein the experimental data input includes optical test data under various driving conditions.

11. The co-design apparatus of claim 10, wherein the various driving conditions include pre-emphasis techniques.

12. A non-transitory computer-readable storage medium encoded with instructions executable by a co-design processor, the computer-readable storage medium comprising:
    instructions to generate simulated photonic data based on a theoretical photonic design that meets a target specification;
    instructions to transmit the simulated photonic data as a first input to a pre-layout simulation of a complementary metal-oxide semiconductor (CMOS) circuit at a CMOS foundry;
    instructions to generate experimental photonic data based on testing of a fabricated photonic device that meets the target specification; and
    instructions to transmit the experimental photonic data as a second input to a post-layout simulation of the CMOS circuit at the CMOS foundry, wherein a physical CMOS circuit design fabricated by the CMOS foundry is based on the pre-layout simulation and the post-layout simulation of the CMOS circuit.

13. The non-transitory computer readable storage medium of claim 12, wherein an optimal design of the theoretical photonic design is based on a convergence of a plurality of parameters of the simulated photonic data and the experimental photonic data.

14. The non-transitory computer readable storage medium of claim 12, wherein the experimental photonic data includes optical test data under various driving conditions.

15. The non-transitory computer readable storage medium of claim 14, wherein the various driving conditions include pre-emphasis techniques.

\* \* \* \* \*